United States Patent
Nomaru (10) Patent No.: US 11,325,204 B2
(45) Date of Patent: May 10, 2022

(54) PROCESSING APPARATUS

(71) Applicant: DISCO CORPORATION, Tokyo (JP)

(72) Inventor: Keiji Nomaru, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 17/082,297

(22) Filed: Oct. 28, 2020

(65) Prior Publication Data

US 2021/0129264 A1    May 6, 2021

(30) Foreign Application Priority Data

Nov. 6, 2019    (JP) .............................. JP2019-201586

(51) Int. Cl.
  *B23K 26/142*    (2014.01)
  *B23K 26/00*    (2014.01)
  *B23K 26/06*    (2014.01)

(52) U.S. Cl.
  CPC ...... *B23K 26/0093* (2013.01); *B23K 26/0626* (2013.01); *B23K 26/142* (2015.10)

(58) Field of Classification Search
  CPC .............. B23K 26/0093; B23K 26/142; B23K 26/0626
  See application file for complete search history.

(56) References Cited

U.S. PATENT DOCUMENTS

| | | | |
|---|---|---|---|
| 2018/0015578 A1* | 1/2018 | Ravindra | B23P 25/006 |
| 2018/0082897 A1* | 3/2018 | Agari | B23K 26/53 |
| 2018/0161921 A1* | 6/2018 | Morikazu | B23K 26/55 |

FOREIGN PATENT DOCUMENTS

| | | |
|---|---|---|
| JP | 2011224758 A | 11/2011 |
| JP | 2013115381 A | 6/2013 |

OTHER PUBLICATIONS

English translation of JP 2011224758 (Year: 2011).*

* cited by examiner

*Primary Examiner* — Michael A Laflame, Jr.
(74) *Attorney, Agent, or Firm* — Greer Burns & Crain Ltd.

(57) ABSTRACT

A processing apparatus includes: a chuck table that is configured to be capable of rotation in a state of supporting the workpiece; a processing unit including a spindle to which a processing tool for grinding or polishing is mounted and a drive source that rotates the spindle; a measuring unit that measures distribution of thickness of the workpiece; a laser beam applying unit that has an adjustor for adjusting power of a laser beam applied to the workpiece; and a control unit including a power setting section that sets the power of the laser beam applied to an arbitrary region of the workpiece based on the distribution of the thickness of the workpiece measured by the measuring unit, and an adjustor control section that controls the adjustor of the laser beam applying unit such as to realize the power of the laser beam set by the power setting section.

10 Claims, 7 Drawing Sheets

PROCESSING APPARATUS

BACKGROUND OF THE INVENTION

Field of the Invention

The present invention relates to a processing apparatus used at the time of grinding or polishing a workpiece.

Description of the Related Art

In electronic apparatuses such as mobile phones and personal computers, device chips including devices such as electronic circuits are indispensable components. The device chips are obtained, for example, partitioning a wafer including a semiconductor material such as silicon into a plurality of regions by streets, forming devices in the regions, and thereafter dividing the wafer along the streets.

Incidentally, in the manufacturing process for the device chips as above, the wafer is often processed by a method such as grinding and polishing. For example, by grinding off a part of the workpiece such as the wafer by a processing tool for grinding including abrasive grains (a grinding wheel in which grindstones are fixed), or by rubbing the workpiece by a processing tool for polishing (polishing pad), it is possible to adjust the thickness of the workpiece or to enhance flatness of the workpiece.

In recent years, there has been proposed a technology in which the relation between the time consumed for polishing and variation in thickness of the workpiece is determined, and, based on the relation, a time for polishing such that the workpiece having a target thickness can be obtained is set (see, for example, Japanese Patent Laid-open No. 2011-224758). As in this technology, the time for polishing is set by utilizing the relation obtained from the result of polishing actually conducted, whereby it is made possible to easily obtain the workpiece having a target thickness.

In addition, a technology has been proposed for enhancing flatness of the workpiece by combining together a recipe at the time of polishing a flat workpiece, a recipe at the time of polishing a workpiece warped in a convex form, and a recipe at the time of polishing a workpiece warped in a concave form (see, for example, Japanese Patent Laid-open No. 2013-115381). In this technology, by suitably adjusting the time for which each of the recipes is applied, the possibility of warping of the polished workpiece is suppressed to a low level.

SUMMARY OF THE INVENTION

Incidentally, in the aforementioned method in which the time for polishing is set by utilizing the relation obtained from the result of an actual processing, the workpiece cannot necessarily be processed to a target thickness when there is variability in the thickness of the workpiece or when the workpiece is warped. In the method of adjusting the time for which each recipe is applied, also, the workpiece cannot necessarily be processed to be flat when variability in the thickness of the workpiece is large or when the workpiece has irregular ruggedness.

Accordingly, it is an object of the present invention to provide a novel processing apparatus with which a workpiece can be processed with high accuracy.

In accordance with an aspect of the present invention, there is provided a processing apparatus used at the time of grinding or polishing a workpiece, the processing apparatus including: a chuck table that has a support surface for supporting the workpiece and that is configured to be capable of rotation in a state of supporting the workpiece; a processing unit that includes a spindle to which a processing tool for grinding or polishing is mounted and a drive source for rotating the spindle; a measuring unit that measures distribution of thickness of the workpiece; a laser beam applying unit that has an adjustor for adjusting power of a laser beam applied to the workpiece; and a control unit that includes a power setting section for setting the power of the laser beam applied to an arbitrary region of the workpiece based on the distribution of the thickness of the workpiece measured by the measuring unit, and an adjustor control section for controlling the adjustor of the laser beam applying unit such as to realize the power of the laser beam set by the power setting section. The control unit adjusts, based on the distribution of the thickness of the workpiece, the power of the laser beam applied to the region of the workpiece to thereby control a removal amount by which the region is removed by a contact with the processing tool.

In addition, in the described aspect of the present invention, the power setting section of the control unit may set the power of the laser beam in a first range such that temperature of the workpiece is raised but the workpiece is not processed.

Besides, in the described aspect of the present invention, the power setting section of the control unit may set the power of the laser beam in, in place of the first range, a second range inclusive of a range for a phase transition of the workpiece and the first range.

In addition, in the described aspect of the present invention, the power setting section of the control unit may set the power of the laser beam in, in place of the first range, a third range inclusive of a range in which the workpiece is processed by the laser beam and the first range.

Besides, in the described aspect of the present invention, the measuring unit is preferably configured to be able to measure the distribution of the thickness of the workpiece in a state in which the region of the workpiece is in contact with the processing tool.

In addition, in the described aspect of the present invention, the processing tool is preferably a polishing pad including a material which transmits the laser beam therethrough, and the laser beam applying unit preferably applies the laser beam to the region of the workpiece through the polishing pad in a state of making contact with the region of the workpiece.

Besides, in the described aspect of the present invention, the processing tool is preferably a polishing pad having a diameter of equal to or less than a radius of the chuck table.

In addition, in the described aspect of the present invention, the measuring unit is preferably disposed on a downstream side of the polishing pad along a direction in which the chuck table is rotated, such that the distribution of the thickness of the workpiece polished by the polishing pad is able to be measured, and the laser beam applying unit is preferably disposed on a downstream side of the measuring unit along the direction in which the chuck table is rotated, such that the laser beam adjusted in power based on the distribution of the thickness of the workpiece measured by the measuring unit is able to be applied to the workpiece.

Besides, in the described aspect of the present invention, the processing unit is preferably able to move the processing tool along a first route not including a region intersecting a rotational axis of the chuck table or a second route including the region intersecting the rotational axis of the chuck table.

In addition, in the described aspect of the present invention, the processing apparatus preferably further include a nozzle unit that jets a gas toward the workpiece, such that a liquid supplied when the processing tool is brought into contact with the workpiece can be removed from a region measured by the measuring unit.

The processing apparatus according to the described aspect of the present invention includes the control unit. The control unit includes the power setting section for setting the power of the laser beam applied to an arbitrary region of the workpiece based on the distribution of the thickness of the workpiece measured by the measuring unit, and the adjustor control section for controlling the adjustor of the laser beam applying unit such as to realize the power of the laser beam set by the power setting section.

Then, by the control unit, the power of the laser beam applied to an arbitrary region of the workpiece is adjusted, and the removal amount by which the arbitrary region is removed by a contact with the processing tool is controlled based on the distribution of the thickness of the workpiece, whereby highly accurate processing according to the distribution of the thickness of the workpiece can be performed. Therefore, according to the processing apparatus according to the described aspect of the present invention, the workpiece can be processed with high accuracy.

The above and other objects, features, and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
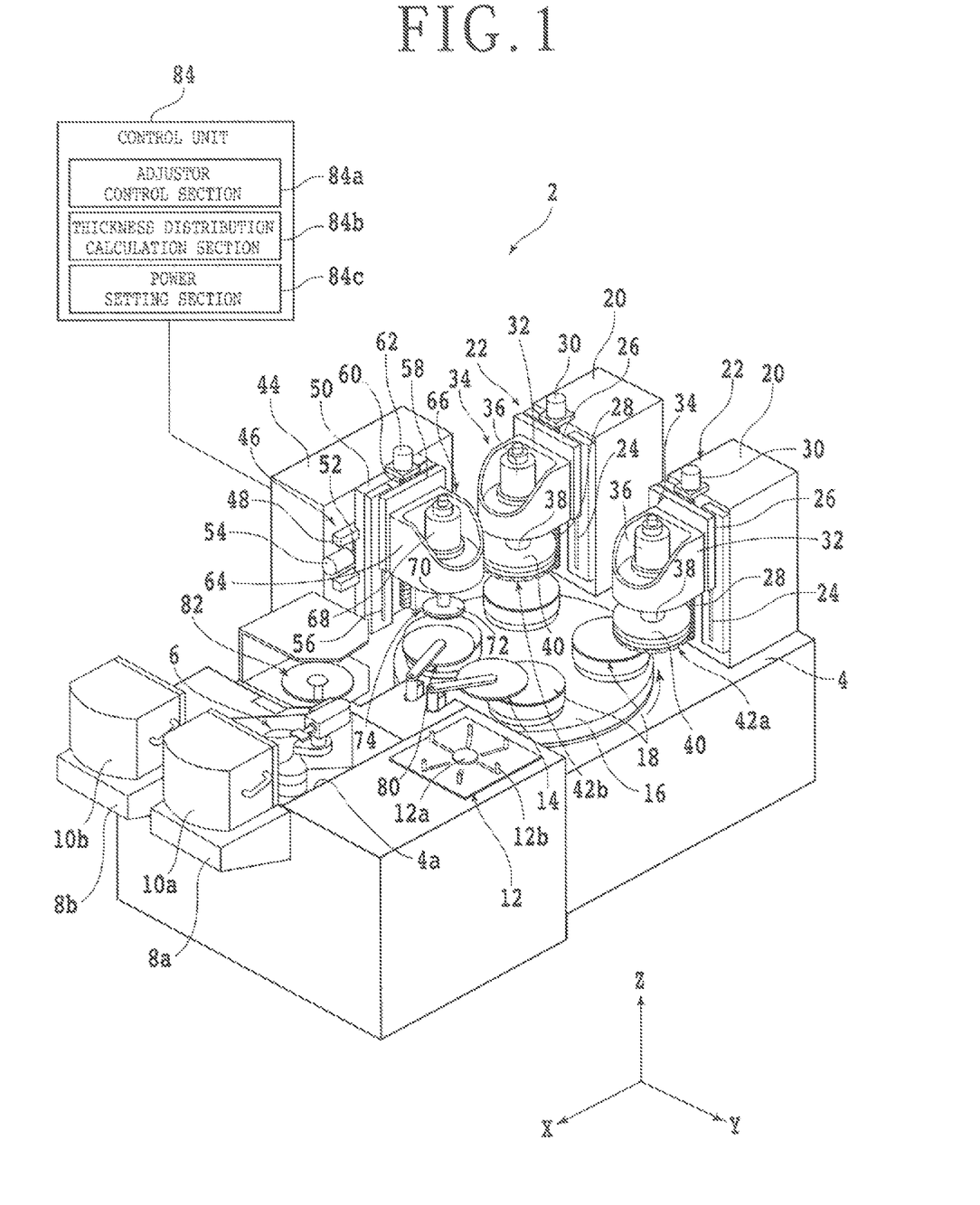
FIG. 1 is a perspective view depicting a configuration example of a processing apparatus.

An embodiment of the present invention will be described referring to the attached drawings. FIG. 1 is a perspective view depicting a configuration example of a processing apparatus 2 according to the present embodiment. Note that in FIG. 1 some of the components of the processing apparatus 2 are depicted in functional blocks. In addition, a forward-rearward direction (X-axis direction), a left-right direction (Y-axis direction) and a vertical direction (Z-axis direction) used in the following description are perpendicular to one another.

As illustrated in FIG. 1, the processing apparatus 2 includes a base 4 that supports each structure. An opening 4a is formed on the front end side of an upper surface of the base 4, and a conveying mechanism 6 for conveying a plate-shaped workpiece 11 (see FIG. 2) is provided in the opening 4a. The workpiece 11 is, for example, a disk-shaped wafer formed by use of a semiconductor such as silicon (Si).

A front surface 11a side of the workpiece 11 is partitioned by a plurality of intersecting streets into a plurality of small regions, and a device such as an integrated circuit (IC) is formed in each of the small regions. In the processing apparatus 2 of the present embodiment, a back surface 11b side of the workpiece 11 is processed. On the other hand, a film-shaped protective member 13 (see FIG. 2) or the like for protecting the devices is adhered to the front surface 11a side of the workpiece 11.

It is to be noted, however, that the material, shape, structure, size and the like of the workpiece 11 are not limited. For example, a substrate formed by use of a material such as another semiconductor, ceramic, resin, or metal or the like may be used as the workpiece 11. Similarly, the kind, number, shape, structure, size, layout and the like of the devices are not limited. The workpiece 11 may not be formed with the devices. Besides, in that case, the protective member 13 may not necessarily be adhered to the front surface 11a side of the workpiece 11.

Cassette tables 8a and 8b are provided on the front side of the opening 4a. Cassettes 10a and 10b capable of accommodating a plurality of the workpieces 11 are placed on the cassette tables 8a and 8b. A position adjusting mechanism 12 for adjusting the position of the workpiece 11 is provided on an oblique rear side of the opening 4a.

The position adjusting mechanism 12 includes, for example, a table 12a configured to be able to support a central portion of the workpiece 11, and a plurality of pins 12b configured to be able to come closer to and away from the table 12a in a region on the outside relative to the table 12a. When the workpiece 11 conveyed out from the cassette 10a by the conveying mechanism 6 is placed on the table 12a, the position of the center of the workpiece 11 is aligned with a central portion of the table 12a by the plurality of pins 12b.

A conveying-in mechanism 14 capable of slewing while holding the workpiece 11 is provided in the vicinity of the position adjusting mechanism 12. The conveying-in mechanism 14 includes a suction pad capable of sucking the whole part on an upper surface side of the workpiece 11 and conveys rearward the workpiece 11 adjusted in position by the position adjusting mechanism 12. A turntable 16 is provided on the rear side of the conveying-in mechanism 14.

The turntable 16 is connected to a drive source (not illustrated) such as a motor and is rotated around a rotational axis which is substantially parallel to the vertical direction. Four chuck tables 18 for supporting the workpiece 11 at the time of processing are provided on an upper surface of the turntable 16 at substantially equal angular intervals. Note that the number of the chuck tables 18 provided on the turntable 16 is not limited.

The conveying-in mechanism 14 sucks the workpiece 11 by the suction pad and conveys in the workpiece 11 onto the chuck table 18 disposed at a conveying-in/out position in the vicinity of the conveying-in mechanism 14. The turntable 16 is, for example, rotated in a direction indicated by an arrow in FIG. 1 and moves each chuck table 18 to the conveying-in/out position, a rough grinding position, a finish grinding position, and a polishing position in this order.

Each chuck table 18 is connected to a drive source (not illustrated) such as a motor and is rotated around a rotational axis which is substantially parallel to the vertical direction (or slightly inclined relative to the vertical direction). A part of an upper surface of each chuck table 18 is a support surface capable of suction supporting the workpiece 11.

The support surface is connected to a suction source (not illustrated) through a flow path (not illustrated) formed inside the chuck table 18. The workpiece 11 conveyed in onto the chuck table 18 has its lower surface side sucked by a negative pressure of the suction source acting on the support surface. In the present embodiment, the front surface 11*a* side of the workpiece 11 is supported by the chuck table 18 through the protective member 13, such that the back surface 11*b* side of the workpiece 11 is exposed on the upper side.

Each of Column-shaped support structures 20 is provided on the rear side of the rough grinding position and the finish grinding position (on the rear side of the turntable 16). Each of vertically moving mechanisms 22 is provided on the front surface side of each support structure 20 (the turntable 16 side). Each vertically moving mechanism 22 includes a pair of guide rails 24 substantially parallel to the vertical direction, and a moving plate 26 is attached in a slidable manner to the pair of guide rails 24.

A nut (not illustrated) constituting a ball screw is fixed to the back surface side (rear surface side) of each moving plate 26, and a screw shaft 28 substantially parallel to the guide rails 24 is screwed into the nut in a rotatable manner. A pulse motor 30 is connected to one end portion of each screw shaft 28. With the screw shaft 28 rotated by the pulse motor 30, the moving plate 26 is moved in the vertical direction along the guide rails 24.

A fixture 32 is provided on the surface (front surface) of each moving plate 26. A grinding unit (processing unit) 34 for grinding the workpiece 11 is supported on each fixture 32. Each grinding unit 34 includes a spindle housing 36 fixed to the fixture 32.

A spindle 38 serving as a rotational axis substantially parallel to the vertical direction (or slightly inclined relative to the vertical direction) is accommodated in each spindle housing 36 in a rotatable manner. A drive source (not illustrated) such as a motor is connected to an upper end side of each spindle 38, and each spindle 38 is rotated by power of the drive source. In addition, a lower end portion of each spindle 38 is exposed from a lower surface of the spindle housing 36. A disk-shaped mount 40 is fixed to the lower end portion of the spindle 38.

A grinding wheel (processing tool for grinding) 42*a* for rough grinding is mounted to a lower surface of the mount 40 of the grinding unit 34 on the rough grinding position side, and a grinding wheel (processing tool for grinding) 42*b* for finish grinding is mounted to a lower surface of the mount 40 of the grinding unit 34 on the finish grinding position side. The grinding wheel 42*a* for rough grinding includes a wheel base formed from a metallic material such as stainless steel or aluminum in a diameter substantially equal to that of the mount 40. A plurality of grindstones including abrasive grains suitable for rough grinding is fixed to a lower surface of the wheel base.

Similarly, the grinding wheel 42*b* for finish grinding includes a wheel base formed from a metallic material such as stainless steel or aluminum in a diameter substantially equal to that of the mount 40. A plurality of grindstones including abrasive grains suitable for finish grinding is fixed to a lower surface of the wheel base. The grain diameter of the abrasive grains included in the grindstones for finish grinding is generally smaller than the grain diameter of the abrasive grains included in the grindstones for rough grinding.

A liquid supply nozzle (not illustrated) for supplying a liquid (grinding liquid) such as pure water to the region (processing point) where the workpiece 11 and the grindstones make contact is disposed in the vicinity of each of the grinding wheels 42*a* and 42*b*. In addition, a contact-type or non-contact-type measuring unit (thickness measuring instrument) (not illustrated) for measuring the thickness of the workpiece 11 is disposed in the vicinity of each of the grinding wheels 42*a* and 42*b*. Note that each of the grinding wheels 42*a* and 42*b* may be provided with an opening for supplying a liquid, and the opening may be used as a liquid supply nozzle.

The workpiece 11 conveyed in onto the chuck table 18 at the conveying-in/out position is sequentially processed by two sets of grinding units 34. Specifically, first, the turntable 16 is rotated, and the chuck table 18 supporting the workpiece 11 is moved from the conveying-in/out position to the rough grinding position.

Next, while the liquid is supplied by the liquid supply nozzle, the chuck table 18 and the grinding wheel 42*a* are rotated relative to each other, and the grindstones of the grinding wheel 42*a* are brought into contact with the back surface 11*b* side (upper surface side) of the workpiece 11 exposed on the upper side. As a result, the workpiece 11 is roughly ground by the grinding unit 34 on the rough grinding position side.

After the processing by the grinding unit 34 on the rough grinding position side is finished, the turntable 16 is further rotated, whereby the chuck table 18 supporting the workpiece 11 is moved from the rough grinding position to the finish grinding position. Then, while the liquid is supplied by the liquid supply nozzle, the chuck table 18 and the grinding wheel 42*b* are rotated relatively to each other, and the grindstones of the grinding wheel 42*b* are brought into contact with the back surface 11*b* side of the workpiece 11. As a result, the workpiece 11 is accurately processed by the grinding unit 34 on the finish grinding position side.

A support structure 44 is provided on a lateral side of the polishing region (a lateral side of the turntable 16). A moving mechanism 46 is provided on the turntable 16 side of the support structure 44. The moving mechanism 46 includes a pair of first guide rails 48 substantially parallel to a front-rear direction, and a first moving plate 50 is attached to the pair of first guide rails 48 in a slidable manner.

A nut (not illustrated) constituting a ball screw is fixed to the back surface side (the support structure 44 side) of the first moving plate 50, and a screw shaft 52 substantially parallel to the first guide rails 48 is screwed into the nut in a rotatable manner. A pulse motor 54 is connected to one end portion of the screw shaft 52. With the screw shaft 52 rotated by the pulse motor 54, the first moving plate 50 is moved in the front-rear direction along the first guide rails 48.

A pair of second guide rails 56 substantially parallel to the vertical direction are provided on the front surface side of the first moving plate 50. A second moving plate 58 is attached to the pair of second guide rails 56 in a slidable manner. A nut (not illustrated) constituting a ball screw is fixed to the back surface side (the first moving plate 50 side) of the second moving plate 58, and a screw shaft 60 substantially parallel to the second guide rails 56 is screwed into the nut in a rotatable manner.

A pulse motor 62 is connected to one end portion of the screw shaft 60. With the screw shaft 60 rotated by the pulse motor 62, the second moving plate 58 is moved in the vertical direction along the second guide rails 56. A fixture 64 is provided on a surface of the second moving plate 58. A polishing unit (processing unit) 66 for polishing the workpiece 11 is supported by the fixture 64.

The polishing unit 66 includes a spindle housing 68 fixed to the fixture 64. A spindle 70 serving as a rotational axis substantially parallel to the vertical direction (or slightly inclined relative to the vertical direction) is accommodated in the spindle housing 68 in a rotatable manner. A drive source (not illustrated) such as a motor is connected to the upper end side of the spindle 70, and the spindle 70 is rotated by power of the drive source.

A lower end portion of the spindle 70 is exposed from a lower surface of the spindle housing 68. A disk-shaped mount 72 is fixed to the lower end portion of the spindle 70. A polishing pad (processing tool for polishing) 74 formed by use of a resin such as a polyurethane foam or a nonwoven fabric is mounted to a lower surface of the mount 72.

The diameter of the polishing pad 74 is equal to or less than the radius of the chuck table 18. Therefore, even when the polishing pad 74 is brought into contact with the workpiece 11 to process the workpiece 11, a partial region of the workpiece 11 is exposed on the upper side. In addition, the polishing pad 74 is provided with, for example, an opening for supplying a liquid (polishing liquid) containing abrasive grains dispersed therein to that region (processing point) of the workpiece 11 which makes contact with the polishing pad 74.

The workpiece 11 having been processed by the grinding unit 34 on the finish grinding position side is processed by this polishing unit 66. Specifically, the turntable 16 is rotated, and the chuck table 18 supporting the workpiece 11 is moved from the finish grinding position to the polishing position. Next, while a liquid is supplied from the opening of the polishing pad 74, the chuck table 18 and the polishing pad 74 are rotated relative to each other, and the polishing pad 74 is brought into contact with the back surface 11b side of the workpiece 11. As a result, the workpiece 11 is processed by the polishing unit 66.

Note that, in the present embodiment, the polishing pad 74 smaller in diameter than the chuck table 18 is used. Therefore, at the time of processing the workpiece 11 by putting the polishing pad 74 into contact with the workpiece 11, it is desirable to appropriately move the polishing pad 74 (or the chuck table 18) such that deviation is not generated in the processing. In the present embodiment, the polishing unit 66 is moved in the front-rear direction by the moving mechanism 46. As a result, the polishing pad 74 can be moved along a route (first route) not including the region of intersecting the rotational axis of the chuck table 18 located at the polishing position. In other words, the polishing pad 74 can be moved such as not to intersect the rotational axis of the chuck table 18.

Figure 2:
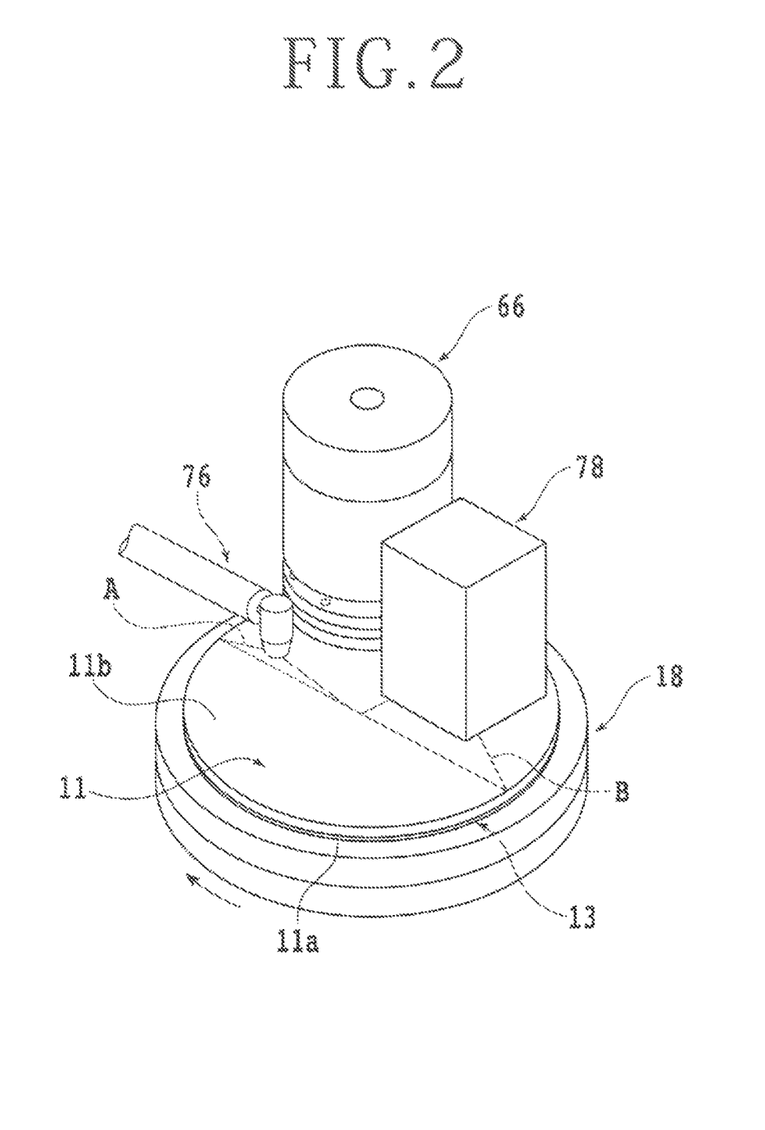
FIG. 2 is a perspective view depicting a structure of a periphery of a polishing unit.

FIG. 2 is a perspective view depicting a structure of a periphery of the polishing unit 66. As illustrated in FIG. 2, a laser beam applying unit 76 configured to be able to apply a laser beam A to the workpiece 11 processed by the polishing unit 66 is disposed on an upstream side of the polishing unit 66 (polishing pad 74) along the direction in which the chuck table 18 is rotated (the direction indicated by an arrow).

In addition, a non-contact-type measuring unit (thickness measuring instrument) 78 configured to be able to measure the distribution of thickness of the workpiece 11 in a state in which the polishing pad 74 is in contact with a part of the workpiece 11 is disposed on a downstream side of the polishing unit 66 (polishing pad 74) along the direction in which the chuck table 18 is rotated. In other words, the laser beam applying unit 76 is disposed on the downstream side of the measuring unit 78 along the direction in which the chuck table 18 is rotated.

Therefore, the measuring unit 78 can measure the distribution of the thickness of the workpiece 11 having been processed by the polishing pad 74. In addition, the laser beam applying unit 76 can apply to the workpiece 11 a laser beam A adjusted in power based on the distribution of the thickness of the workpiece 11 measured by the measuring unit 78. Details of the laser beam applying unit 76 and the measuring unit 78 will be described later.

As illustrated in FIG. 1, a conveying-out mechanism 80 capable of slewing while holding the workpiece 11 having been processed by the polishing unit 66 is provided at a position on a lateral side of the conveying-in mechanism 14. A cleaning mechanism 82 configured to be able to clean the workpiece 11 conveyed out by the conveying-out mechanism 80 is disposed on the front side of the conveying-out mechanism 80 and on the rear side of the opening 4a. The workpiece 11 cleaned by the cleaning mechanism 82 is conveyed by the conveying mechanism 6, and is, for example, accommodated into the cassette 10b.

A control unit 84 is connected to each of the aforementioned components. The control unit 84 controls the operation and the like of each component such that the workpiece 11 can be processed appropriately. For example, the control unit 84 controls operations of the laser beam applying unit 76 and the measuring unit 78 in accordance with a target shape of the workpiece 11.

The control unit 84, typically, includes a computer including a processing apparatus such as a central processing unit (CPU) and a storage apparatus such as a flash memory. By operating the processing apparatus and the like according to a software stored in the storage apparatus, various functions of the control unit 84 are realized.

Figure 3:
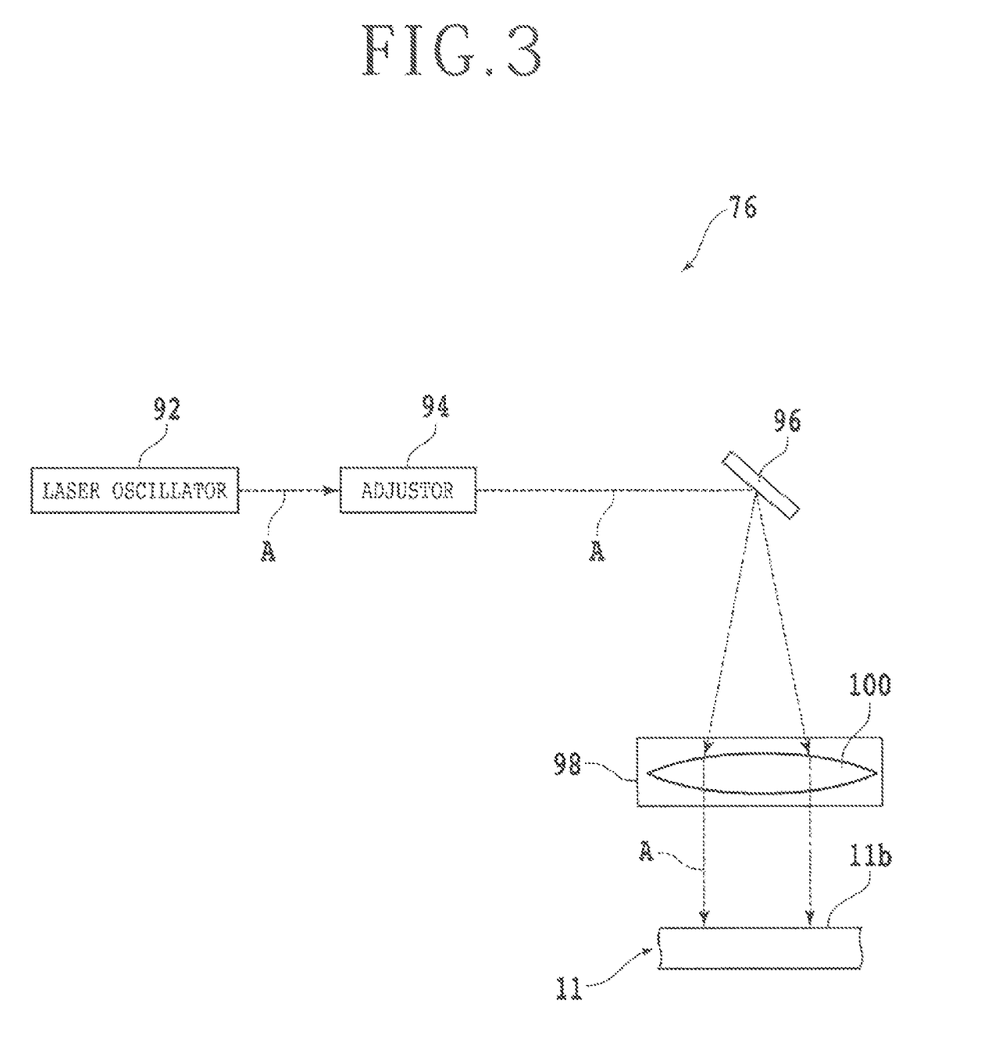
FIG. 3 is a diagram depicting a configuration example of a laser beam applying unit.

FIG. 3 is a diagram depicting a configuration example of the laser beam applying unit 76. Note that in FIG. 3, also, some components are depicted in functional blocks. As illustrated in FIG. 3, the laser beam applying unit 76 includes a laser oscillator 92 capable of generating a laser beam A of such a wavelength as to be absorbed in the workpiece 11.

For example, in a case of processing the workpiece 11 formed by use of silicon, the laser oscillator 92 capable of generating the laser beam A of a wavelength of 532 nm is used. It is to be noted, however, that the laser oscillator 92 may be configured to be able to generate a laser beam of other wavelength. In addition, the mode of the laser oscillation performed by the laser oscillator 92 may be continuous wave (CW) oscillation or may be pulsed oscillation. In the present embodiment, the laser oscillator 92 capable of continuous wave oscillation is used.

An adjustor 94 such as an attenuator capable of adjusting the power of the laser beam A radiated from the laser oscillator 92 is disposed at a position adjacent to the laser oscillator 92. An adjustor control section 84a (FIG. 1) of the control unit 84 is connected to the adjustor 94, and the operation of the adjustor 94 is controlled by the adjustor control section 84a of the control unit 84.

The laser beam A adjusted in power by the adjustor 94 is incident on a mirror 96. The mirror 96 is connected to a drive source (not illustrated) such as a motor and is rotated around a rotational axis. The control unit 84 adjusts the angle of the mirror 96 around the rotational axis, to thereby control the propagating direction of the laser beam A. The laser beam A reflected by the mirror 96 is applied to the back surface 11b of the workpiece 11 through a condenser 98. The condenser 98 includes an fθ lens 100 and condenses the laser beam A onto the back surface 11b of the workpiece 11 irrespectively of the propagating direction of the laser beam A.

In the present embodiment, the position of a region to which the laser beam A is applied is changed by the mirror 96 along a linear route substantially parallel to the back surface 11b of the workpiece 11. In other words, the laser beam A is linearly scanned by the mirror 96. The linear route is desirably set along a radial direction passing through the center of the workpiece 11, such that the laser beam A can be applied to the whole part of the back surface 11b of the workpiece 11.

When the laser beam A is scanned along the radial direction of the workpiece 11 while rotating the chuck table 18 and adjusting the power of the laser beam A by the adjustor 94, the laser beam A of arbitrary power can be applied to an arbitrary region of the back surface 11b of the workpiece 11. In the processing apparatus 2 of the present embodiment, by controlling the power of the laser beam A and the region to which the laser beam A is applied, the temperature of the workpiece 11 is adjusted on a region basis, whereby the amount (removal amount) by which the workpiece 11 is removed by the polishing unit 66 is controlled on a region basis.

Figure 4:
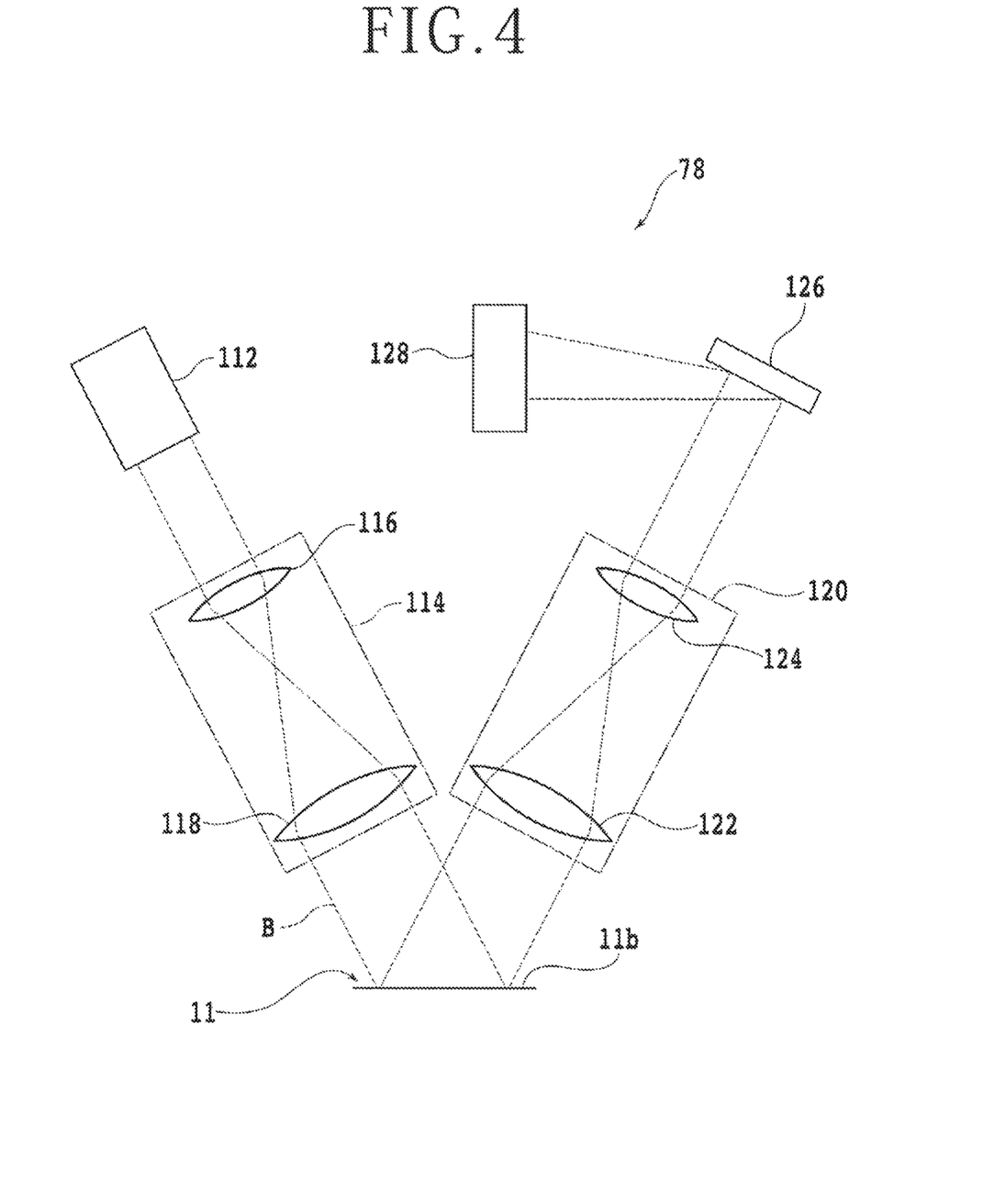
FIG. 4 is a diagram depicting a configuration example of a measuring unit.

FIG. 4 is a diagram depicting a configuration example of the measuring unit 78. As illustrated in FIG. 4, the measuring unit 78 includes, for example, a white light source 112 capable of generating white light B including visible light. This white light source 112 radiates white light B of which shape in section perpendicular to the propagating direction (hereinafter, referred to as sectional shape) is linear (one-dimensional).

As the white light source 112, there is selected, for example, a super luminescent diode (SLD) light source, an amplified spontaneous emission (ASE) light source, a super continuum (SC) light source, a light emitting diode (LED) light source, a halogen lamp, a xenon lamp, a mercury lamp, a metal halide lamp or the like. Note that, in a case where an LED light source, a halogen lamp, a xenon lamp, a mercury lamp, a metal halide lamp or the like is selected as the white light source 112, a lens or a pinhole or the like may be combined therewith such that the light source can be handled as a point light source.

An enlarging optical system 114 capable of enlarging the aforementioned sectional shape of the white light B radiated from the white light source 112 in a longitudinal direction is disposed at a position adjacent to the white light source 112. The enlarging optical system 114 includes, for example, a first lens 116 for enlarging the sectional shape of the white light B in the longitudinal direction, and a second lens 118 for making the white light B enlarged by the first lens 116 close to parallel light.

The white light B transmitted through the enlarging optical system 114 is applied to the back surface 11b and the front surface 11a (not illustrated in FIG. 4) of the workpiece 11. Since the sectional shape of the white light B is linear as described above, the white light B is applied to a linear region even on the back surface 11b (and the front surface 11a) of the workpiece 11.

Note that the distribution of the thickness of the workpiece 11 is measured in the region to which the white light B is applied. In other words, the region to which the white light B is applied is a region where the distribution of the thickness is measured. Therefore, the region to which the white light B is applied is desirably set along the radial direction passing through the center of the workpiece 11, such that the region is moved over the whole part of the workpiece 11 by rotating the chuck table 18.

A nozzle unit (not illustrated) capable of jetting a gas toward the workpiece 11 is disposed in the vicinity of the region to which the white light B is applied. A gas is jetted from the nozzle unit to the region to which the white light B is applied and which is the region for measurement, and the liquid supplied to the workpiece 11 is removed from the region for measurement, whereby the distribution of the thickness of the workpiece 11 can be appropriately measured in the region for measurement.

The white light B reflected respectively by the back surface 11b and the front surface 11a of the workpiece 11 is incident on a reducing optical system 120 capable of reducing the sectional shape in the longitudinal direction. The reducing optical system 120 includes, for example, a third lens 122 for reducing the sectional shape of the white light B in the longitudinal direction, and a fourth lens 124 for making the white light B reduced by the third lens 122 close to parallel light.

A spectroscopic unit 126 capable of dispersing the white light B transmitted through the reducing optical system 120 into lights of different wavelengths is disposed at a position adjacent to the reducing optical system 120. This spectroscopic unit 126 is typically a diffraction grating and radiates lights of different wavelengths constituting the white light B into directions satisfying the conditions for interference (that is, the directions different according to the wavelengths).

In the present embodiment, the lights of different wavelengths constituting the white light B are radiated in directions intersecting the longitudinal direction of the sectional shape of the white light B. In other words, the shape in section of the light transmitted through the spectroscopic unit 126 (the shape in section perpendicular to the propagating direction) is planar (two-dimensional). The planar light transmitted through the spectroscopic unit 126 is incident on a two-dimensional imaging unit 128.

The two-dimensional imaging unit 128 includes an imaging element such as a charge coupled device (CCD) image sensor or a complementary metal oxide semiconductor (CMOS) image sensor, and upon receiving light having a two-dimensional magnitude distribution, generates an electrical signal on which the magnitude distribution of the light is reflected. In other words, by this two-dimensional imaging unit 128, information concerning two-dimensional magnitude distribution generated by superimposition (interference) of the light reflected by the back surface 11b and the light reflected by the front surface 11a of the workpiece 11 can be acquired.

As described above, when the white light B is incident on the spectroscopic unit 126, the white light B is separated on a wavelength basis along the direction intersecting the longitudinal direction of the sectional shape. In other words, a first axis of the two-dimensional magnitude distribution obtained by the two-dimensional imaging unit 128 represents the position on the back surface 11b (or the front surface 11a) of the workpiece 11, and a second axis intersecting the first axis represents wavelength.

The two-dimensional imaging unit 128 is connected to a thickness distribution calculation section 84b (FIG. 1) of the control unit 84. The information concerning the two-dimensional magnitude distribution of light acquired by the two-dimensional imaging unit 128 is sent to the thickness distribution calculation section 84b of the control unit 84. The thickness distribution calculation section 84b, in consideration of the conditions such as the incidence angle of the white light B on the workpiece 11, calculate the distribution of the thickness of the workpiece 11, from the information concerning the two-dimensional magnitude distribution acquired by the two-dimensional imaging unit 128.

The information concerning the distribution of the thickness of the workpiece 11 is sent to a power setting section 84c (FIG. 1) of the control unit 84. Based on the information concerning the distribution of the thickness of the workpiece 11 received from the thickness distribution calculation section 84b and the information concerning a target shape (target thickness distribution) of the workpiece 11, the power setting section 84c calculates the power of the laser beam A according to the amount (scheduled removal amount) of the workpiece 11 to be removed by the polishing unit 66, on a region basis.

The information concerning the power of the laser beam A thus calculated is sent to the adjustor control section 84a of the control unit 84. The adjustor control section 84a controls the operation of the adjustor 94 such as to realize the power of the laser beam A set by the power setting section 84c. As a result, the power of the laser beam A applied to an arbitrary region of the workpiece 11 is adjusted based on the distribution of the thickness of the workpiece 11.

Here, the speed at which the workpiece 11 is removed by a contact with the polishing pad 74 varies according to the temperature of the region where the workpiece 11 and the polishing pad 74 make contact with each other. Therefore, by adjusting the power of the laser beam A applied to an arbitrary region of the workpiece 11 and controlling the temperature of the region, the amount (removal amount) by which the region is removed by the polishing pad 74 can be controlled.

As described above, the control unit 84 of the present embodiment controls the power of the laser beam A applied to an arbitrary region of the workpiece 11 based on the distribution of the thickness of the workpiece 11. In other words, the control unit 84 adjusts the power of the laser beam A applied to an arbitrary region of the workpiece 11, whereby the removal amount by which the region is removed by the contact with the polishing pad 74 can be controlled based on the distribution of the thickness of the workpiece 11. Therefore, high-accuracy processing according to the distribution of the thickness of the workpiece 11 can be performed.

Figure 5:
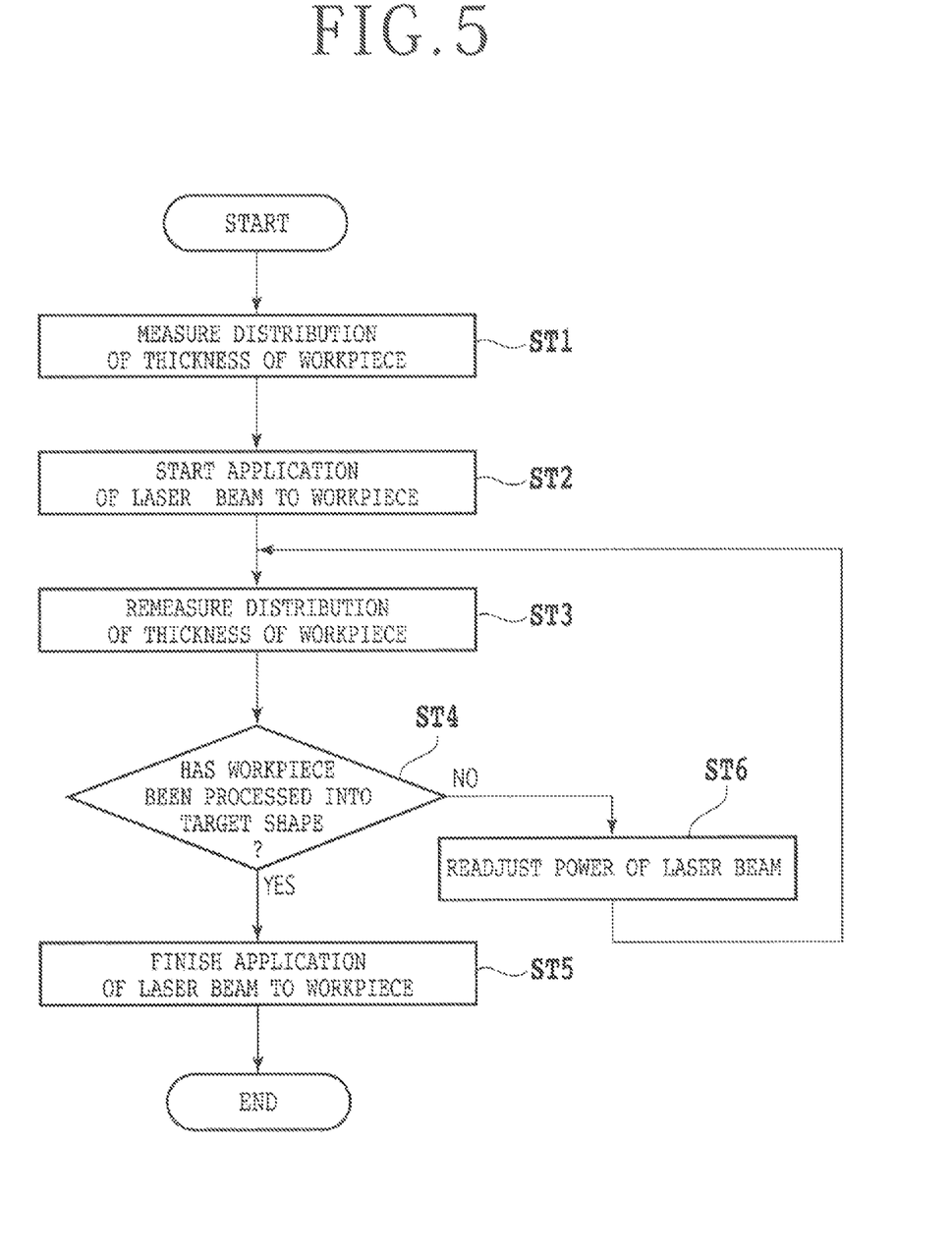
FIG. 5 is a flow chart depicting a part of a processing method for a workpiece.

Next, a workpiece processing method conducted using the aforementioned processing apparatus 2 will be described below. FIG. 5 is a flow chart depicting a part of the workpiece processing method. Note that, in FIG. 5, a treatment performed at the time of processing the workpiece 11 by the polishing unit 66 is mainly illustrated. In the workpiece processing method according to the present embodiment, first, the back surface 11b side of the workpiece 11 is processed by the grinding unit 34 on the rough grinding position side (first grinding step). Next, the back surface 11b side of the workpiece 11 is processed by the grinding unit 34 on the finish grinding position side (second grinding step).

Then, the workpiece 11 is processed by the polishing unit 66 (polishing step). Specifically, the chuck table 18 supporting the workpiece 11 is moved to a polishing position. Next, while a liquid in which abrasive grains are dispersed is supplied, the chuck table 18 and the polishing pad 74 are rotated relative to each other, and the polishing pad 74 is brought into contact with the back surface 11b side of the workpiece 11. As a result, the workpiece 11 is processed by the polishing unit 66.

When the processing of the workpiece 11 by the polishing unit 66 is started, a treatment depicted in FIG. 5 is also started. Specifically, first, by the aforementioned measuring unit 78, the distribution of thickness of the workpiece 11 is measured (measuring step ST1). In other words, white light B radiated from the white light source 112 is applied to the workpiece 11, and the white light B reflected by the workpiece 11 is separated into lights of different wavelengths by the spectroscopic unit 126. Then, information concerning two-dimensional magnitude distribution of the light is acquired by the two-dimensional imaging unit 128.

After the information concerning the two-dimensional magnitude distribution of the light is acquired, the distribution of thickness of the workpiece 11 is calculated by the thickness distribution calculation section 84b of the control unit 84. Specifically, by utilizing interference conditions differing on a wavelength basis of the light reflected by the back surface 11b and the light reflected by the front surface 11a of the workpiece 11, the distribution of the thickness of the workpiece 11 is calculated from the information concerning the two-dimensional magnitude distribution of the light. Note that the information concerning the distribution of the thickness is sent to the power setting section 84c of the control unit 84.

After the distribution of the thickness of the workpiece 11 is measured, application of the laser beam A to the workpiece 11 is started (laser beam applying step ST2). In the present embodiment, by the laser beam applying unit 76, the laser beam A adjusted in power based on the information of the distribution of the thickness is applied to the back surface 11b of the workpiece 11.

Specifically, first, the power setting section 84c of the control unit 84 calculates the power of the laser beam A according to a scheduled removal amount of the workpiece 11 on a region basis, from the information concerning the distribution of the thickness of the workpiece 11 and the target shape of the workpiece 11 (target thickness distribution). In other words, the power of the laser beam A corresponding to the difference between the thickness of the workpiece 11 in each region and the target thickness (that is, scheduled removal amount) is calculated.

The information concerning the power of the laser beam A thus calculated is sent to the adjustor control section 84a of the control unit 84. The adjustor control section 84a controls the operation of the adjustor 94 such as to realize the power of the laser beam A set by the power setting section 84c. In other words, based on the distribution of the thickness of the workpiece 11, the power of the laser beam A applied to each region of the workpiece 11 is adjusted.

As a result, the laser beam A adjusted in power based on the information concerning the distribution of the thickness can be applied to each region of the workpiece 11. When the laser beam A is applied to each region of the workpiece 11, the temperature of the region of the workpiece 11 is raised according to the power of the laser beam A applied.

The speed at which the workpiece 11 is removed by the contact with the polishing pad 74 depends on the temperature of the region where the workpiece 11 and the polishing pad 74 make contact with each other. Therefore, by applying the laser beam A adjusted in power to each region of the workpiece 11, as in the present embodiment, the removal amount by which each region of the workpiece 11 to which the laser beam A is applied is removed by the contact with the polishing pad 74 can be controlled.

For example, by not applying the laser beam A to a thin region of the workpiece 11 indicated by the distribution of the thickness but applying the laser beam A to a thick region of the workpiece 11, the removal amount by which the thick region of the workpiece 11 is removed can be set larger than the removal amount by which the thin region of the workpiece 11 is removed.

In addition, for example, by making strong the power of the laser beam A applied to the thick region of the workpiece 11 as compared to the laser beam A applied to the thin region of the workpiece 11, the removal amount by which the thick region of the workpiece 11 is removed can be set larger than the removal amount by which the thin region of the workpiece 11 is removed.

While the power of the laser beam A is not specifically limited, the power setting section 84c of the control unit 84 can adjust the power of the laser beam A, for example, in a range (first range) such that the temperature of the workpiece 11 is raised but the workpiece 11 is not processed.

Besides, the power setting section 84c of the control unit 84 can set the power of the laser beam A in a range (second range) obtained by adding a range in which the workpiece 11 undergoes a phase transition to the aforementioned range (first range) in which the workpiece 11 is not processed.

Further, the power setting section 84c of the control unit 84 can set the power of the laser beam A, for example, in a range (third range) obtained by adding a range in which the workpiece 11 is processed to the aforementioned range (first range) in which the workpiece 11 is not processed. Note that the range in which the workpiece 11 is processed includes a range in which the workpiece 11 undergoes a phase transition. In other words, the third range is wider than the second range.

At the time of adjusting the power of the laser beam A, it is preferable that the control unit 84 adjusts together the conditions such as the position, movement and the like of the polishing pad 74 relative to the chuck table 18 (the workpiece 11). For example, by moving the polishing pad 74 such that the dwelling time in the thin region of the workpiece 11 indicated by the distribution of the thickness is short and the dwelling time in the thick region of the workpiece 11 is long, the removal amount by which the thick region of the workpiece 11 is removed can be enlarged.

After the application of the laser beam A to the workpiece 11 is started, the distribution of the thickness of the workpiece 11 is remeasured (remeasuring step ST3). This remeasurement is conducted by a method similar to that for the first-time measurement. The information concerning the distribution of the thickness thus remeasured is sent to the power setting section 84c of the control unit 84.

After the distribution of the thickness of the workpiece 11 is remeasured, it is determined whether or not the workpiece 11 has been processed into a target shape (determining step ST4). Specifically, the power setting section 84c of the control unit 84 calculates a scheduled removal amount of the workpiece 11 on a region basis, from the information concerning the distribution of the thickness of the workpiece remeasured and the information concerning the target shape of the workpiece 11. In addition, the power of the laser beam A suitable for realizing the scheduled removal amount is calculated on a region basis.

For example, in a case where any of the scheduled removal amounts of regions calculated do not exceed a reference amount (the range allowed for the workpiece 11 after processing), the control unit 84 determines that the workpiece 11 has been processed into a target shape. In this case (determining step ST4: YES), the control unit 84 finishes the application of the laser beam A to the workpiece 11 (application finishing step ST5), and finishes the processing of the workpiece 11 by the polishing unit 66.

On the other hand, for example, in a case where any of the scheduled removal amounts of the regions calculated exceed the reference amount (the range allowed for the workpiece 11 after processing), the control unit 84 determines that the workpiece 11 has not been processed into the target shape. In this case (determining step ST4: NO), the control unit 84 readjusts the power of the laser beam A applied to the workpiece 11 (readjusting step ST6).

In other words, the adjustor control section 84a of the control unit 84 receives the information concerning the power of the laser beam A set by the power setting section 84c and controls the operation of the adjustor 94 such as to realize the power of the laser beam A set by the power setting section 84c. As a result, based on the distribution of the thickness of the workpiece 11 remeasured, the power of the laser beam A applied to an arbitrary region of the workpiece 11 is readjusted.

Note that at the time of readjusting the power of the laser beam A, also, it is desirable that the control unit 84 readjusts together the conditions such as the position and movement of the polishing pad 74 relative to the chuck table 18 (the workpiece 11). After the power of the laser beam A is readjusted, the distribution of the thickness of the workpiece 11 is remeasured at a predetermined timing (remeasuring step ST3).

In this way, the remeasurement of the distribution of the thickness of the workpiece 11 and the readjustment of the power of the laser beam A based on the distribution of the thickness remeasured are alternately repeated, whereby highly accurate processing of the workpiece 11 can be performed. Note that the frequency (or period) concerning the repetition of the remeasurement of the distribution of the thickness and the readjustment of the power of the laser beam A is not particularly limited, and, by enlarging the frequency to a certain extent (shortening the period to a certain extent), it becomes easy to process the workpiece 11 with high accuracy. For example, it is recommendable to set the repetition frequency to within the range of 0.5 Hz to 1 kHz.

Note that the present invention can be carried out with various modifications without being limited by the above description of the embodiment. For example, while the processing apparatus 2 including the nozzle unit capable of jetting a gas to the region to be measured by the measuring unit 78 is illustrated in the above embodiment, the processing apparatus of the present invention may include another structure for permitting measurement by the measuring unit 78.

Figure 6:
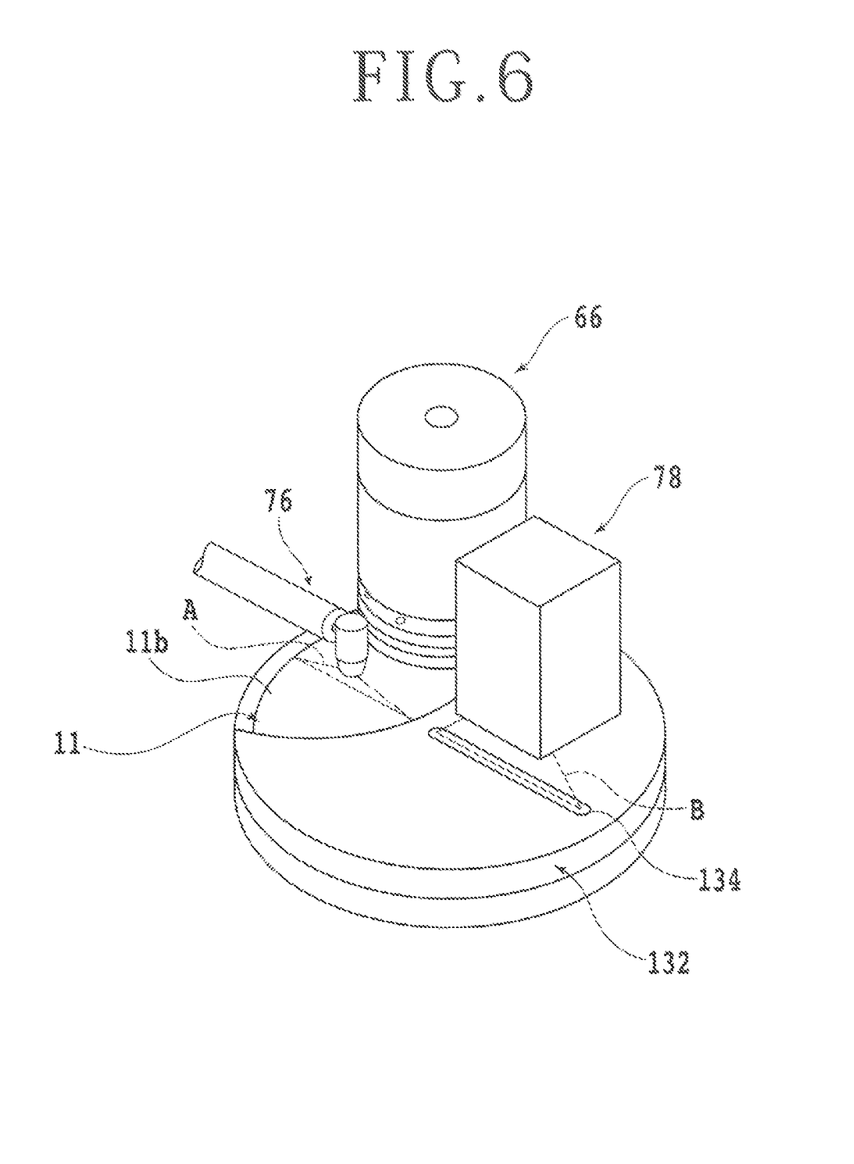
FIG. 6 is a perspective view depicting a structure of a periphery of a polishing unit of a processing apparatus according to a first modification.

FIG. 6 is a perspective view depicting a structure of a periphery of the polishing unit 66 of the processing apparatus according to a first modification. Note that, in FIG. 6, the same components as those of the processing apparatus 2 according to the embodiment mentioned above are denoted by the same reference symbols as used above. In the processing apparatus according to the first modification, a cover 132 is mounted to an upper portion of the chuck table 18 moved to the polishing position.

A transparent window 134 formed of a material transmitting the white light B used in the measuring unit 78 is provided at an upper surface of the cover 132. This window 134 is disposed directly above a region to which the white light B is applied (the region to be measured of the workpiece 11). Note that, while the cover 132 is provided with the window 134 transmitting the white light B therethrough in the first modification, the whole part of the cover 132 may be formed of a material that transmits the white light B therethrough.

In addition, the cover 132 is configured such that, in a state of being mounted to the chuck table 18, the distance (spacing) between the workpiece 11 supported by the chuck table 18 and the window 134 is sufficiently small. For this reason, the liquid supplied to the workpiece 11 at the time of processing hardly remain in the region to which the white light B is applied on a lower side of the window 134. Therefore, even in a case where a liquid not transmitting the white light B sufficiently therethrough is used, the distribution of the thickness of the workpiece 11 can be measured by the measuring unit 78.

Note that the cover 132 is configured such that, in a state of being mounted to the chuck table 18, a part of the back surface 11b of the workpiece 11 supported by the chuck table 18 is exposed. Therefore, even in the state in which the cover 132 is mounted to the chuck table 18, the workpiece 11 can be suitably processed by the polishing unit 66.

In addition, while the processing apparatus 2 in which the measuring unit (thickness measuring instrument) 78 is disposed on the downstream side of the polishing unit 66 (the polishing pad 74) along the direction in which the chuck table 18 is rotated and the laser beam applying unit 76 is disposed on the downstream side of the measuring unit 78 is illustrated in the above embodiment, the disposition of each component may be modified as desired.

Figure 7:
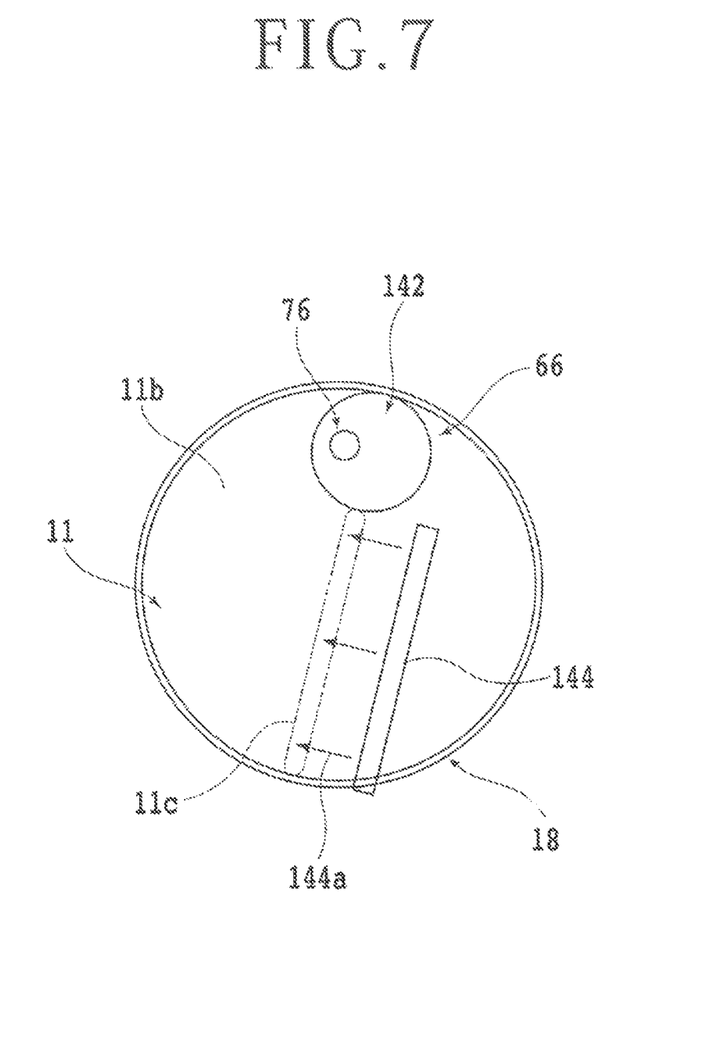
FIG. 7 is a plan view depicting a structure of a periphery of a polishing unit of a processing apparatus according to a second modification.

For example, the laser beam applying unit may be disposed in such a region as to overlap with the polishing unit (polishing pad) in plan view. FIG. 7 is a plan view depicting a structure of a periphery of the polishing unit 66 of a processing apparatus according to a second modification. Note that, in FIG. 7, the same components as those of the processing apparatus 2 according to the embodiment mentioned above are denoted by the same reference symbols as used above.

In the processing apparatus according to the second modification, a polishing pad 142 formed of a material transmitting the laser beam A applied from the laser beam applying unit 76 is used. The laser beam applying unit 76 is disposed in such a region as to overlap with the polishing pad 142 in plan view. Note that a nozzle unit 144 capable of jetting a gas 144a toward the workpiece 11 is disposed in such a region as not to overlap with the polishing pad 142 in plan view.

In the processing apparatus according to the second modification, the laser beam A is applied to the region of the workpiece 11 that makes contact with the polishing pad 142, through the polishing pad 142 in a state of making contact with an arbitrary region of the workpiece 11. In other words, the workpiece 11 can be processed by the polishing pad 142 simultaneously with the application of the laser beam A, and, therefore, it is easy to suppress the power of the laser beam A to a low level.

The size of the polishing pad 142 is not particularly limited. For example, a polishing pad 142 of such a size as to cover the whole part of the workpiece 11 may be used. It is to be noted, however, that in that case, it is necessary to form the polishing pad 142 by using a material that transmits the laser beam A therethrough and transmits therethrough the white light B used in the measuring unit 78. The nozzle unit 144 may be omitted.

While the laser beam applying unit 76 that applies the laser beam A to each region by use of the mirror 96 is illustrated in the above embodiment, the structure of the laser beam applying unit possessed by the processing apparatus of the present invention is not particularly limited. For example, a laser beam applying unit that applies a laser beam to each region by use of a polygon mirror, a Galvano scanner, a diffractive optical element (DOE), a liquid crystal on silicon (LCOS), a digital micromirror device (DMD) or the like may be adopted. In addition, the adjustor that adjusts the power of the laser beam may be provided inside the laser oscillator.

Besides, while the measuring unit 78 that measures the distribution of the thickness of the workpiece 11 on a one-dimensional basis by utilizing the white light B of which shape in section perpendicular to the propagating direction (sectional shape) is linear is illustrated in the above embodiment, a measuring unit capable of measuring the distribution of the thickness of the workpiece on a two-dimensional basis may be used for the processing apparatus of the present invention, for example.

In addition, while the processing apparatus 2 capable of moving the polishing pad 74 along the route (first route) not including the region intersecting the rotational axis of the chuck table 18 is illustrated in the above embodiment, the processing apparatus of the present invention may be configured such as to be capable of moving the processing tool along a route (second route) including the region intersecting the rotational axis of the chuck table. In other words, the processing tool may be moved along the radial direction of the chuck table (workpiece).

Besides, while the processing apparatus 2 capable of processing the workpiece 11 with high accuracy according to the distribution of the thickness at the time of polishing the workpiece 11 is illustrated in the above embodiment, the processing apparatus of the present invention may be configured such as to be able to process the workpiece 11 with high accuracy according to the distribution of the thickness at the time of grinding the workpiece 11. In this case, for example, a laser beam applying unit and a measuring unit (thickness measuring instrument) are disposed in the vicinity of the grinding unit.

In addition, while the processing apparatus 2 including both the grinding unit 34 used for grinding of the workpiece 11 and the polishing unit 66 used for polishing of the workpiece 11 is illustrated in the above embodiment, it is sufficient that the processing apparatus of the present invention includes at least one of the grinding unit and the polishing unit.

The structures and methods and the like concerning the above-described embodiment and modifications may be modified in carrying out the present invention within such a range as not to depart from the scope of the object of the invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing apparatus used at a time of grinding or polishing a workpiece, the processing apparatus comprising:
   a chuck table that has a support surface for supporting the workpiece and that is configured to be capable of rotation in a state of supporting the workpiece;
   a processing unit that includes a spindle to which a processing tool for grinding or polishing is mounted and a drive source for rotating the spindle;
   a measuring unit that measures distribution of thickness of the workpiece;
   a laser beam applying unit that has an adjustor for receiving a laser beam output by a laser oscillator, adjusting a power of the laser beam, and outputting the laser beam with the adjusted power to the workpiece; and
   a control unit that includes
      a power setting section for setting the adjusted power of the laser beam applied to an arbitrary region of the workpiece based on the distribution of the thickness of the workpiece measured by the measuring unit, and an adjustor control section for controlling the adjustor of the laser beam applying unit such as to realize the adjusted power of the laser beam set by the power setting section, the control unit adjusting, based on the distribution of the thickness of the workpiece, the adjusted power of the laser beam applied to the region of the workpiece to thereby control a removal amount by which the region is removed by a contact with the processing tool.

2. The processing apparatus according to claim 1, wherein the power setting section of the control unit sets the adjusted power of the laser beam in a first range such that temperature of the workpiece is raised but the workpiece is not processed.

3. The processing apparatus according to claim 2, wherein the power setting section of the control unit sets the adjusted power of the laser beam in, in place of the first range, a second range inclusive of a range for a phase transition of the workpiece and the first range.

4. The processing apparatus according to claim 2, wherein the power setting section of the control unit sets the adjusted power of the laser beam in, in place of the first range, a third range inclusive of a range in which the workpiece is processed by the laser beam and the first range.

5. The processing apparatus according to claim 1, wherein the measuring unit is configured to be able to measure the distribution of the thickness of the workpiece in a state in which the region of the workpiece is in contact with the processing tool.

6. The processing apparatus according to claim 1, wherein the processing tool is a polishing pad including a material which transmits the adjusted laser beam therethrough, and the laser beam applying unit applies the adjusted laser beam to the region of the workpiece through the polishing pad in a state of making contact with the region of the workpiece.

7. The processing apparatus according to claim 1, wherein the processing tool is a polishing pad having a diameter of equal to or less than a radius of the chuck table.

8. The processing apparatus according to claim 7, wherein the measuring unit is disposed on a downstream side of the polishing pad along a direction in which the chuck table is rotated, such that the distribution of the thickness of the workpiece polished by the polishing pad is able to be measured, and the laser beam applying unit is disposed on a downstream side of the measuring unit along the direction in which the chuck table is rotated, such that the laser beam adjusted in power based on the distribution of the thickness of the workpiece measured by the measuring unit is able to be applied to the workpiece.

9. The processing apparatus according to claim 1, wherein the processing unit is able to move the processing tool along a first route not including a region intersecting a rotational axis of the chuck table or a second route including the region intersecting the rotational axis of the chuck table.

10. The processing apparatus according to claim 1, further comprising:

a nozzle unit that jets a gas toward the workpiece, such that a liquid supplied when the processing tool is brought into contact with the workpiece can be removed from a region measured by the measuring unit.

* * * * *